(12) United States Patent
Thwaites

(10) Patent No.: US 6,463,873 B1
(45) Date of Patent: Oct. 15, 2002

(54) HIGH DENSITY PLASMAS

(75) Inventor: Michael J. Thwaites, Hampshire (GB)

(73) Assignee: Plasma Quest Limited, Farnborough (GB)

( * ) Notice: Subject to any disclaimer, the term of this patent is extended or adjusted under 35 U.S.C. 154(b) by 0 days.

(21) Appl. No.: 09/542,880

(22) Filed: Apr. 4, 2000

(51) Int. Cl.[7] .......................... C23C 16/00; C23C 14/00
(52) U.S. Cl. ............................... 118/723 IR; 118/723 I; 118/723 AN; 204/298.01; 204/298.16
(58) Field of Search ......................... 118/723 I, 723 IR, 118/723 MR, 723 ME, 723 MA, 723 AN, 723 E, 723 ER; 156/345; 204/298.01, 298.02, 298.08, 298.2, 298.22, 298.19, 298.21, 298.16

(56) References Cited

U.S. PATENT DOCUMENTS

| | | | | |
|---|---|---|---|---|
| 4,844,775 A | * | 7/1989 | Keeble | 156/643 |
| 4,990,229 A | * | 2/1991 | Campbell et al. | 204/298.06 |
| 5,122,251 A | * | 6/1992 | Campbell et al. | 204/298.06 |
| 5,429,070 A | * | 7/1995 | Campbell et al. | 118/723 R |
| 5,690,050 A | * | 11/1997 | Doi | 118/723 MP |
| 5,919,342 A | * | 7/1999 | Ngan | 204/192.22 |
| 6,015,465 A | * | 1/2000 | Kholodenko et al. | 118/719 |
| 6,080,287 A | * | 6/2000 | Drewery et al. | 204/192.15 |
| 6,132,575 A | | 10/2000 | Pandumsoporn et al. | |
| 6,297,595 B1 | * | 10/2001 | Stimson et al. | 315/111.51 |

FOREIGN PATENT DOCUMENTS

| | | | |
|---|---|---|---|
| DE | 199 36 199 | 3/2000 | |
| EP | 0064288 A1 | 11/1982 | |
| EP | 0403418 A2 | 12/1990 | |
| EP | 0489407 A2 | 6/1992 | |
| EP | 0 489 407 | 6/1992 | |
| EP | 0774886 A1 | 5/1997 | |
| EP | 0790328 A1 | 8/1997 | |
| EP | 0837490 A2 | 4/1998 | |
| JP | 1-139762 A | * 6/1989 | ........... C23C/14/36 |
| WO | 99/57746 | 11/1999 | |

OTHER PUBLICATIONS

Tobe et al., "Plasma–Enhanced CVD of TiN of Ti Using Low–Pressure and High–Density Helicon Plasma", Thin Solid Films, Ch, Elsevier–Sequoia S.A. Lausanne, Aug. 1, 1996, vol. 281/282, No. 1/02, pp. 155–158.

* cited by examiner

Primary Examiner—Gregory Mills
Assistant Examiner—P. Hassanzadeh
(74) Attorney, Agent, or Firm—Nixon & Vanderhye P.C.

(57) ABSTRACT

A high density plasma forming apparatus is configured to sputter material from a target unto a substrate. The apparatus comprises a process chamber, a target mounted within the process chamber, and a substrate mounted within the process chamber and configured to receive material sputtered from the target. The apparatus further includes a magnetic field generator by which the plasma may be directed unto the target, a side arm open to the process chamber, and a radio frequency antenna for forming a plasma in the side arm. The radio frequency antenna is a helical coil wound around the external surface of the side arm. In use, the plasma generated within the side arm enters the process chamber in a first direction and is deflected from an angle from the first direction within the process chamber.

51 Claims, 3 Drawing Sheets

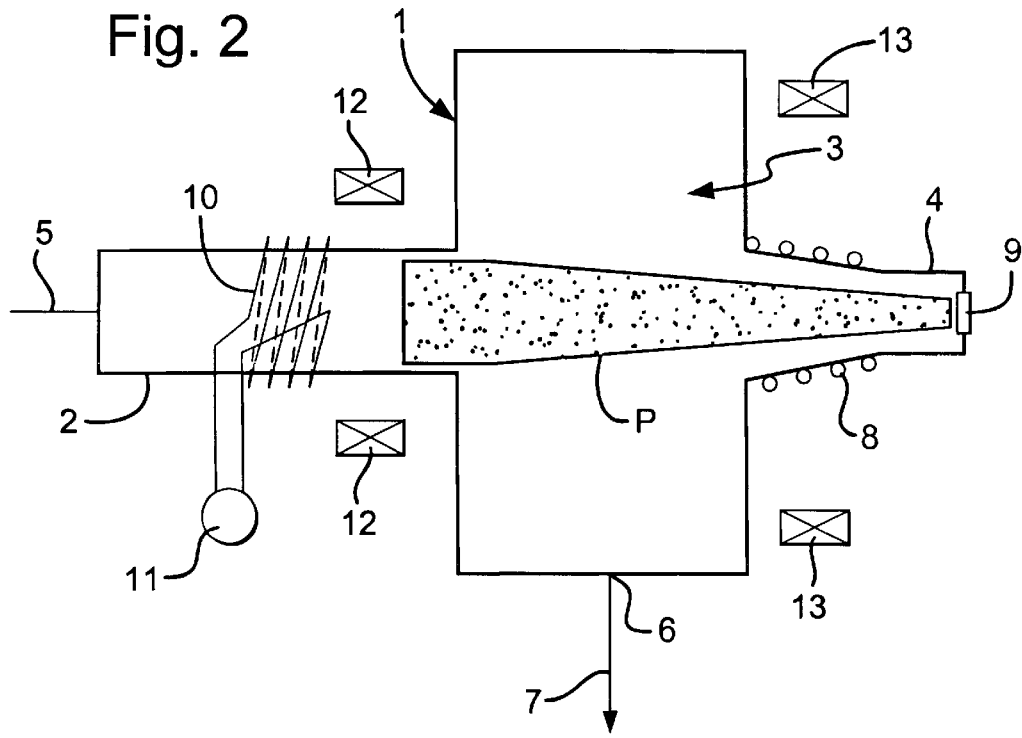
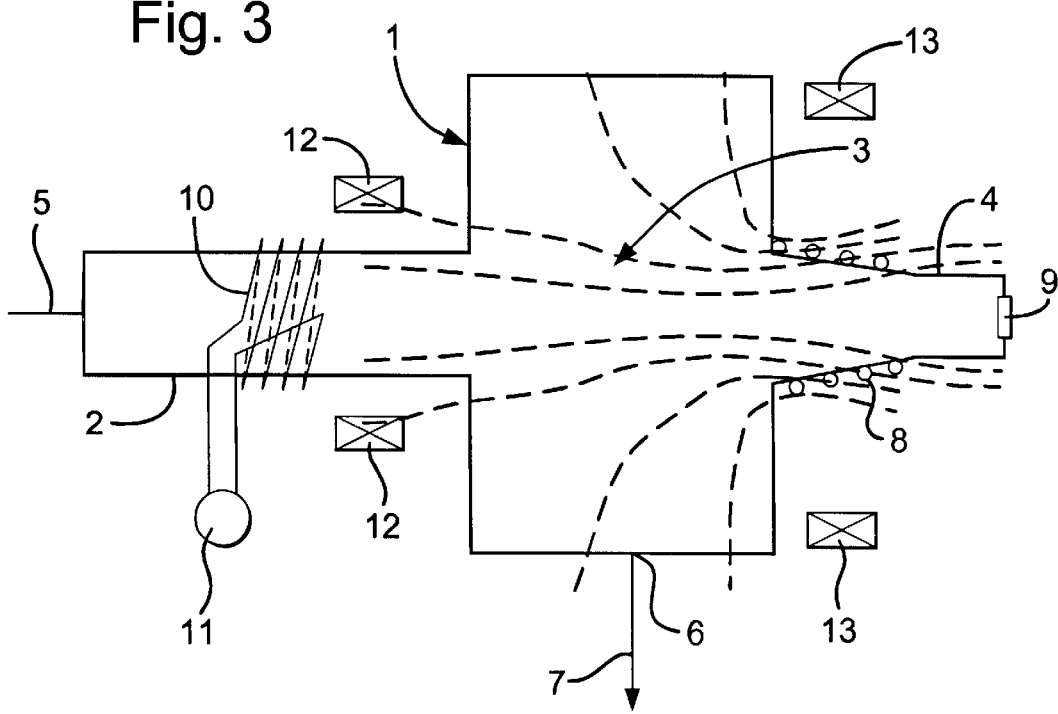

HIGH DENSITY PLASMAS

BACKGROUND OF THE INVENTION

1. Field of the Invention

This invention relates to methods and apparatus for the production of high density plasmas.

2. Description of Related Art

A variety of different processes are operated in a plasma environment including thin film coating, for example sputtering, evaporation, chemical vapour disposition, cleaning and etching processes.

For example, it has been known for many years that thin film deposition processes and the properties of the deposited films themselves can be Improved by allowing energetic ions to impinge on the growing surface of the film being deposited; this is due to an energy transfer between the energetic ions and the so-called "adatoms" of the thin film being deposited. This increases the surface mobility of the adatoms and allows them to migrate more readily to the preferred lattice sites.

Sputtering processes are widely used for the deposition of thin coatings or films of materials on to substrates. Such processes take place in an evacuated chamber containing a small quantity of an ionisable gas, for example argon. Electrons emitted from a source held within the chamber ionise the gas to form a plasma; a (cathode) target comprising the material to be sputtered is bombarded by the ions causing atoms of the target material to be dislodged and subsequently deposited on to the substrate being coated.

It is also well known that the rate of deposition in sputtering process may be increased by the use of magnetic means, for example an array of permanent magnets positioned in a predetermined manner (commonly as a closed loop) associated with the cathode target to create in use a plasma which is localised and concentrated along a sputtering zone of the target and thereby defined the area or region from which sputtering, or erosion of the target occurs.

In vapour deposition processes, especially plasma enhanced chemical vapour deposition (PECVD), a chemical gad contained within a vacuum chamber is dissociated and activated by the plasma at a rate generally proportional to the density of the plasma.

In plasma etching or cleaning processes, energetic ions and/or chemically active ions and/or chemically active ions produced by a plasma present in a vacuum chamber are employed to remove material from a substrate, for example in the production of semi conductor integrated circuits.

In all such processes, an important parameter is the ability to produce high density plasmas at the lowest possible power consumption. Benefits of high density plasmas include the production of higher grade coatings in general, commonly allow for a greater homogeneity in the coating microstructure, It has previously been proposed to produce high density plasmas by means of electron cyclotron resonance (ECR) by use of microwaves at a specific frequency of 2.45 GHz and a magnetic field of 875 Gauss in vacuum. Although this produces a useful high density plasma, the size of the required magnetic field is such that it consumes high power levels and is therefore expensive.

A more recent proposal for the production of high density plasmas is the use of high density plasma waves. These can be produced in a chamber at high vacuum, for example $10^{-2}$ to $10^{-4}$ mbar, by interaction between a uniform magnetic field and an electric field profile of an external antenna operating at a radio frequency (RF). Wave energy from the antenna emissions is transferred to the electrons produced in a plasma discharge, for example argon, present in the chamber by the well known mechanism known as Landau damping; with these waves, energy exchange is thought to occur in a much more efficient manner than with other types of discharge. This effect can generally be regarded as a collisionless damping of waves in a plasma due to particles in the plasma which possesses a velocity almost equal to the phase velocity of the wave. Such particles tend to travel with the wave without "seeing" a rapidly fluctuating electric field and can therefore exchange energy with the wave. A plasma containing electrons some of which are faster and some of which are slower than the wave itself. However, in a Maxwellian distribution, there are more slower electrons than faster ones and therefore there are more particles receiving energy from the plasma wave than those Imparting energy to the wave.

The 13.56 MHz frequency discharge is the most widely used to produce high density plasma waves, although related frequencies of 6.78 MHz and 27.12 MHz could also be employed.

High density plasma wave induced plasma generation can usefully be performed in a chamber in which, or about which, field coils are present to effect a uniform magnetic field (commonly cylindrical) in a pre-determined area of the chamber. Three such field coils in a linear array spaced along the length of the relevant past of the chamber are generally sufficient. At one end of the array is positioned the RF antenna to cause, in use of the process, the intense plasma wave produced by interaction between the magnetic field and the RF power supply, which in turn accelerates plasma electrons by the Landau damping mechanism.

The design of the RF antenna required to produce helicon waves and the subsequent generation of a high density plasma is important. The design has been the subject of considerable discussion in original papers by Boswell and subsequently by Chen and thereafter by various other authors.

Previous designs have centred on complex configurations in which the various operating modes are embodied to provide in particular, a double loop system made from a continuous length of conductive material in which:

- a first loop having a main axis which is orientated parallel to the direction of the magnetic field present in the chamber;
- a second loop also having a main axis which is orientated parallel to the direction of the magnetic field present in the chamber; and
- an electrical cross linkage between the first and second loops of varying design.

Although it has been shown that the use of helicon wave systems can produce high density plasmas to good effect, the complexity of the RF antenna and their spatial configuration with the magnetic array required to Interact with the RF power can provide difficulties in the implementation of helicon wave production of helicon wave plasmas.

BRIEF SUMMARY OF THE INVENTION

The invention is concerned with the provision of high density plasma systems embodying an antenna of simpler, easier to use design and having further benefits as described below.

In accordance with the invention, there is provided a high density plasma forming device having a housing comprising an ionisable gas, a process chamber, a target mounted within the process chamber, at least one source chamber completely open at one end to the process chamber, a radio frequency antenna for the formation of a plasma and a magnetic means by which the plasma may be directed and focused onto the target, wherein the antenna is a helical coil associated with the source chamber such that plasma formed within the source chamber is directed into the process chamber and focused onto the target mounted therein.

In accordance with a further aspect of the invention there is provided a process for forming a high density plasma comprising the steps of:

(i) supplying a helical coil radio frequency antenna with a discharge power supply, and (ii) inducing the ionisation of an ionisable gas within the source chamber completely open at one end to a process chamber to form a plasma, and (iii) the direction and focusing of the plasma within a process chamber by magnetic means. The invention also provides a process for forming a high density plasma utilising the apparatus of the invention as described above, It has surprisingly been found that the use of a helically wound coil antenna, as opposed to the complex antennae used previously, can be used to good effect and to provide additional technical benefits leading to a factor of three enhancement in the plasma ion density. The helically wound coil antenna in the invention generally comprises an electrically conducting strip or wire with one end connected to the RF live supply and the other to earth (ground) and hence returns to an RF matching unit. As such, the RF power passes through each turn of the helically wound coil in turn between the two ends.

The RF supply should generally be within the range of 1 to 200 MHz, however, the preferred frequencies would be within the range 1 to 30 MHz with frequencies of 6.78 MHz, 13.56 MHz and 27.12 MHz the most preferred. In general the RF frequency is surprisingly not crucial as long as the RF source is matched with the antenna in a manner known per se.

The process of the invention should preferably be performed in a chamber made of an insulating material for example a generally cylindrical chamber, wherein quartz and glass are preferred materials.

In preferred embodiments, the helically wound coil antenna can conveniently be wound around the outside of the relevant part of the chamber. This is especially applicable in the case of a metallic, for example brass, strip antenna around an insulating, for example quartz, chamber. The antenna is preferably cooled, for example water cooled.

The helically wound coil antenna preferably comprises at least three turns and advantageously comprises from three to eight turns, for example three, four or five. The RF power applied to the helically wound coil antenna must be matched in a manner known per se to ensure the formation of a high density plasma wave in to the magnetic field present in the chamber.

The antenna must be adapted to generate an RF electric field, interaction between this electric field and the magnetic field generates a modified electric field which in turn produces a plasma wave which couples energy to plasma electrons through a Landau damping mechanism which in turn causes high ionisation of the plasma gas and hence a high intensity plasma.

The magnet means can comprise a single magnet, for example an annular solenoid placed coaxially about the chamber and positioned remote from the antenna to produce, in use a magnetic field relative to the antenna axis between the magnet and the antenna.

Preferably, however, the magnetic means comprises more than one magnet. In preferred embodiments, there is provided a first (source) magnet associated with the antenna and a second (chamber) magnet positioned remote from the antenna to generate a linked magnetic field.

In certain embodiments, the source magnet is preferably an annular solenoid positioned co-axially about the helically wound coil antenna with a small clearance between the external diameter of the antenna and the internal diameter of the solenoid. In some cases, however, the source chamber magnet is slightly removed to the side of the antenna away from the chamber magnet, or even to the opposite side of the process chamber whilst remaining co-axial therewith.

In other preferred embodiments, the process chamber magnet also comprises an annular solenoid positioned co-axially with the antenna axis but having a larger diameter than the source magnet. In order to allow the magnetic lines of flux to bridge the process chamber.

As an example, the source magnet can be such that it generates a magnetic field of the order of $5 \times 10^{-3}$ Tesla parallel to the axis of the source chamber and/or antenna and the process chamber magnet can generate a stronger magnetic field of the order of $5 \times 10^{-2}$ Tesla again parallel to the central axis of the source chamber and/or antenna with the linked magnetic field being in accordance with the invention.

In the case of the use of solenoid magnet(s) in particular, the current flowing through the solenoid(s) determines the magnetic field strength, the magnetic field gradient across the chamber (if any) and the direction of the overall field. This is critical to the overall operation of the process and the control of its operating parameters.

In general, in the case of using more than one magnet, the source and each chamber magnet must generate respective magnetic fields in the same direction; it should be noted, however, that the process works irrespective of the selected same direction.

An advantage of the invention is the use of a further magnet on one side of the chamber between the source magnet (or the antenna if no source magnet is employed) and the chamber magnet surprisingly allows the plasma beam to be attracted or "steered" in the process chamber towards or away from the further magnet depending on the polarity of the magnet. In such embodiments, the use of a solenoid is advantageous in that switching the solenoid current in one direction will deflect the plasma towards the solenoid and switching the current in the other direction would repel the plasma away from the solenoid.

There may, in certain circumstances, be problems associated with the deposition of material from a target present in the plasma not only on to a substrate held within the vacuum chamber but also on to the internal surfaces of the vacuum chamber, particularly when used for coating processes.

Such problems are generally associated with RF leakage via such coatings on the internal surfaces which has an effect increasingly as the coatings become thicker and/or more widespread of reducing the overall efficiently of the coating process.

In further preferred embodiments of the invention, therefore, it is proposed that the apparatus includes a vacuum process chamber having a source chamber in which the antenna is deployed, with magnet means present in the vicinity of the source chamber and the process chamber to propagate the magnetic field and thereby to generate the high density plasma out of the source chamber and in to the process chamber.

In such an arrangement, a target comprising material to be deposited and a substrate on to which the target material is to deposited can be situated in the process chamber. In such an arrangement, even though some deposition may occur on the process chamber surfaces, relatively low or zero amounts of deposition of target material will generally occur on the interior surfaces of the source chamber where the antenna is positioned. As a result, RF leakage from the RF antenna via chamber surface deposits should be avoided.

BRIEF DESCRIPTION OF THE DRAWINGS

For a better understanding of the invention, reference will now be made, by way of exemplification only, to the accompanying drawings in which:

FIG. 2 is a schematic representation of the cross-section of an embodiment of the invention;

FIG. 3 is a further schematic representation of an apparatus of an embodiment of the invention;

DETAILED DESCRIPTION OF THE INVENTION

Figure 1:
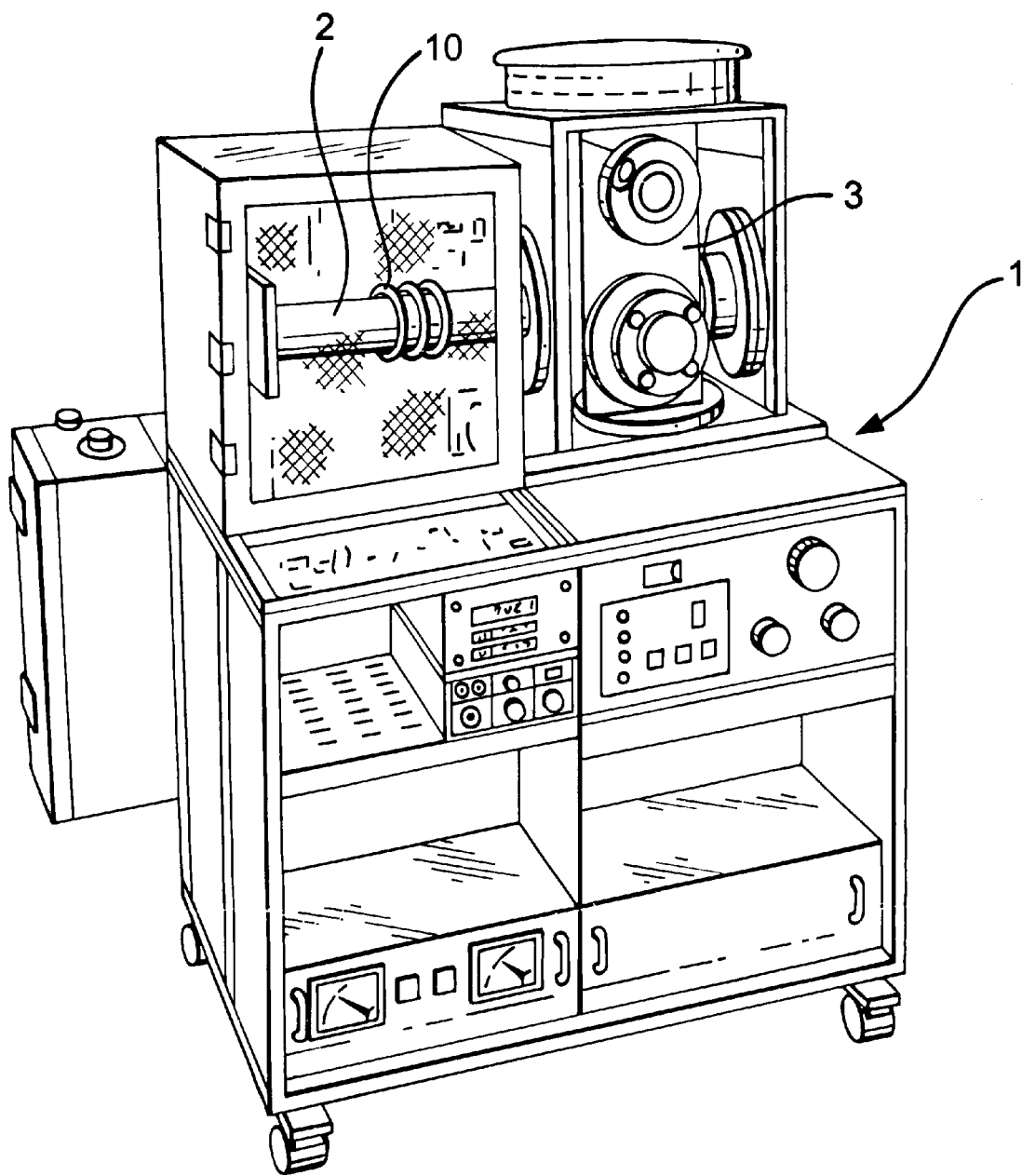
FIG. 1 is a schematic representation of an apparatus of the invention.

FIG. 1 shows the external appearance of an embodiment of the invention 1 having a process chamber 3 a source chamber 2 with an associated coil 10.

FIG. 2 shows a schematic representation of apparatus of the invention. There is shown therein a substantially cylindrical vacuum chamber 1 having a source chamber 2 of a first cross section, a process chamber 3 of larger cross section and a termination end 4 of tapering cross section.

The source chamber has an inlet 5 in to which ionisable process gas can be introduced, The process chamber 3 has an outlet 6 attached to vacuum pumps at 7 for evacuating the vacuum chamber 1 and, in use of the apparatus, causing a flow of process gas therethough. The termination end 4 is water cooled by a helically arranged water pipe 8; the end of the termination end 4 contains a glass view port 9 for observing the plasma 'P' generated in the chamber.

A helically wound coil annular antenna 10 having four turns and being in the form of a brass strip whose ends are electrically insulated from each other with one end connected to an RF power supply 11 and the other end connected to earth. The four turns were each spaced apart from adjacent turns by about one or two centimetres. The overall length of the antenna was of the order of six to eight centimetres. The RF supply was at a frequency of 13.56 MHz.

About the antenna and co-axial therewith is a source magnet 12 in the form of an annular solenoid having an internal diameter slightly greater than the external diameter of the antenna and electrically isolated therefrom. Activation of the solenoid magnet 12 is by connection to a power source (not shown).

About the termination end 4 of the chamber 1 is a chamber magnet 13 in the form of another annular solenoid having a larger diameter than the source magnet 12.

The exemplified apparatus of FIG. 2 has a source chamber 2 made of quartz and an internal diameter of one-hundred-and-fifty millimetres, a wider process chamber 3 and a termination end 4 of initial diameter the same as that of the source chamber 2 but tapering in a direction away from process chamber 3.

In use of the apparatus with the vacuum pumps at 7 turned on, the source and chamber solenoids 12, 13 respectively are both turned on with the windings of both solenoids generating magnetic fields parallel, to the axis of the process chamber in the same direction and the chamber magnet 13 generating the larger individual magnetic field effect ($5 \times 10^{-2}$ Tesla) than that of the source magnet ($5 \times 10^{-3}$ Tesla) but with the fluxes of the respective magnetic fields being linked to produce a non-axial magnetic field overall relative to the main (longitudinal) axis of the helically wound coil antenna 10. Typical flux lines of such a non-axial magnetic field are shown in FIG. 3 showing the same type of apparatus to that of FIG. 2. It should be noted, however, that the use of a uniform magnet field is not essential as generally there will be some non-uniformity in respect of the magnetic field.

The magnetic field so formed means that in use there is 3 magnetic gradient increasing in a direction away from the antenna 10 and the generated RF electric field must interact with lines of magnet flux In the vacuum chamber.

In addition, cooling water was passed through the helically arrayed pipe 8 and argon (ionisable) gas was present in the evacuated vacuum chamber 1 the chamber pressure should preferably range between $7 \times 10^{-5}$ mbar and $2 \times 10^{-2}$ mbar.

The operation of the apparatus shown in FIG. 2 showed that a high density plasma beam P was formed at low pressures. In particular, the argon ion efficiency was calculated to be in excess of thirty percent at 5 kW power and $8 \times 10^{-4}$ mbar pressure.

Figure 4:
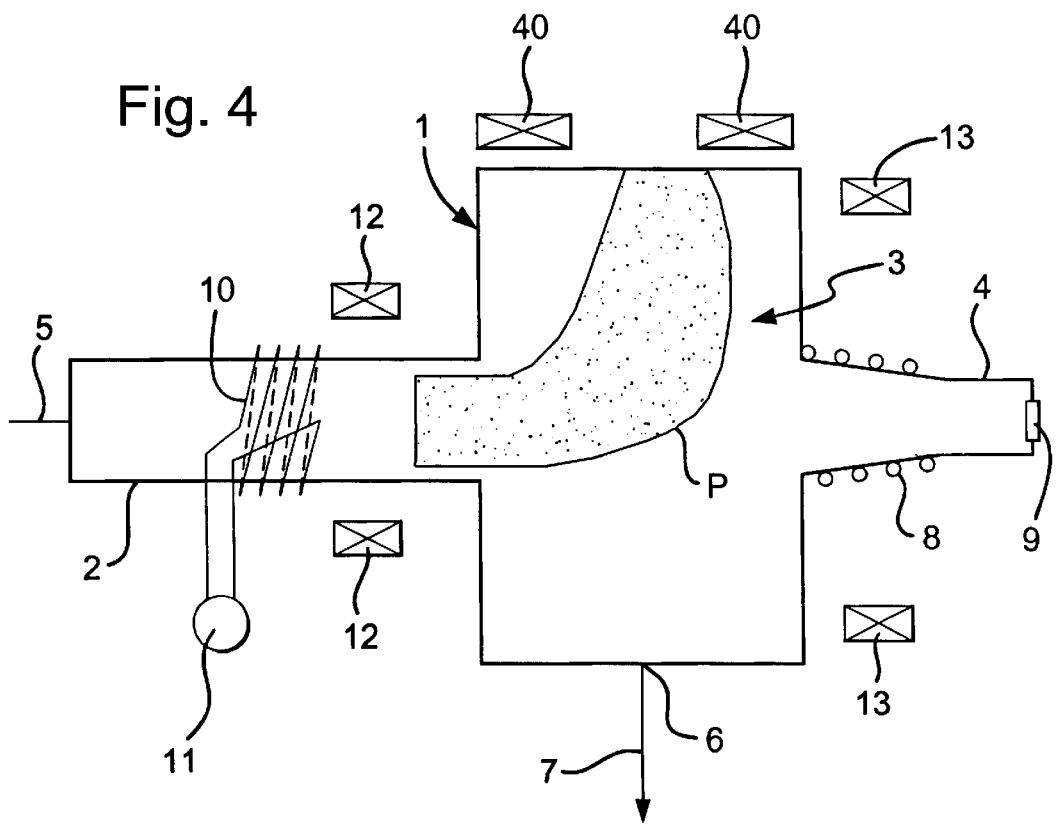
FIG. 4 is a schematic representation of the cross-section of a second preferred embodiment of the invention possessing magnetic means to divert the flow of plasma.

FIG. 4 shows the use of a steering magnet 40 as an addition to the apparatus shown in FIG. 2. This steering magnet is in the form of an annular solenoid positioned on one side of the process chamber 3 (the top as shown). In use, the polarity of the solenoid magnet determines whether the plasma beam P is deflected or steered towards the steering magnet 40 (as shown) or alternatively away from the magnet.

The ability to steer the plasma beam may be of considerable benefit in certain coating methods in which the control of the direction of the plasma in relation to the substrate is important, for example a substrate positioned in the upper or lower part of the process chamber 3.

Figure 5:
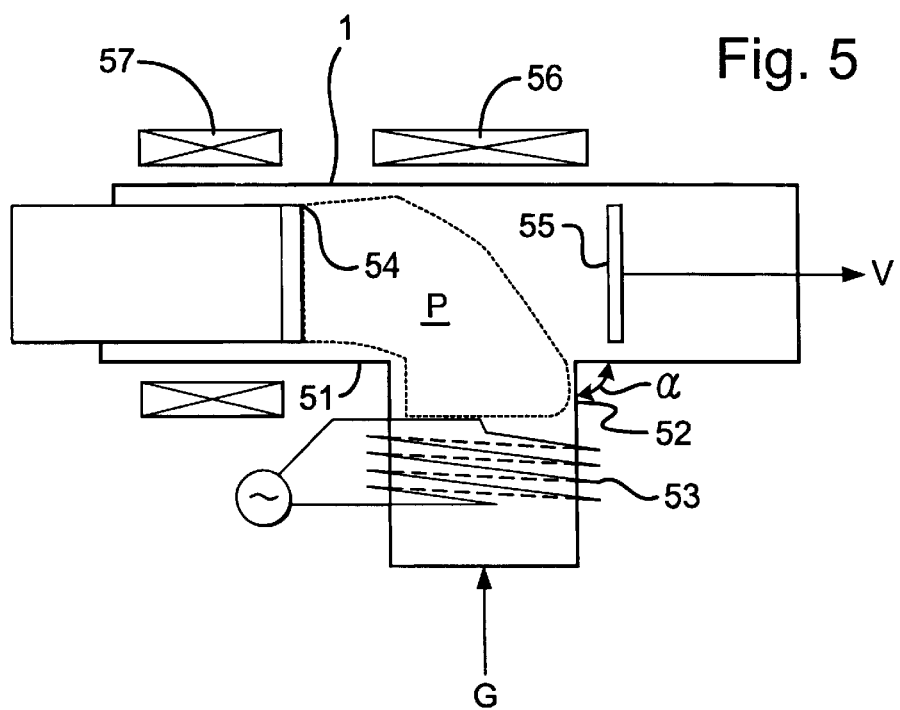
FIG. 5 is a further schematic representation of the cross-section of an the second preferred embodiment of FIG. 4.

In this respect, FIG. 5 shows the use of a source chamber having a central longitudinal axis parallel with, but not co-linear with the plane of the target. The target being positioned such that plasma entering the process chamber from the source chamber needs to be substantially deflected towards the target.

The apparatus of FIG. 5 includes a cylindrical vacuum chamber 1 having a process chamber 51 and a source chamber 52 in which a RF helically wound coil antenna 53 is deployed. Also present in the chamber 1 is a target 54 having a surface of material to the sputtered and a substrate 55 in to which the target material is to be deposited.

Electromagnetic means 56 at the top (as shown) of the process chamber 51 opposite the source chamber 52, or to the right of the antenna and further electromagnetic means 57 positioned about the process chamber 51 provide, in use of the apparatus, magnetic means to generate a magnetic field which, by interaction with the electric field profile of the RF antenna 53 in use of the apparatus, produces a high density plasma wave.

In use of the apparatus of FIG. 5, introduction of gas, for example again, in to the chamber in the direction of the arrow G will be chamber 1 evacuated by means of vacuum pumps (not shown) acting in the direction of the arrow V again allows a very high intensity plasma to be generated by means of the high density plasma wave propagated from the helically wound coil antenna 53 and to be present by virtue of the electromagnetic means 56, 57 in the general area with dotted lines indicated by the reference letter P between the target 54 and a substrate 55.

The ability to produce a high intensity plasma P in FIG. 5 between the target 54 and the substrate 55 from an antenna 63 present in the source chamber and therefore remote from the coating area of the chamber clearly affords the possibility of avoiding or at least minimising RF leakage from the antenna in that substantially no coating of the internal wall of the chamber should occur in the source chamber in the vicinity of the antenna 53.

It is possible for the source chamber 52 to have a different orientation to that shown in FIG. 5 by making the angle a more than the ninety degrees shown in FIG. 5 for example one hundred and thirty-five degrees. This would afford the greater possibility of avoiding RF leakage from the antenna 53 in that even less coating should be effected on the wall of the source chamber 52.

What is claimed is:

1. A high density plasma forming apparatus configured to sputter material from a target onto a substrate, the apparatus comprising:
    a chamber having a longitudinal axis, the chamber being made of an electrically insulating material,
    an outlet to said chamber,
    an evacuator for evacuating said chamber through said outlet,
    a source chamber forming part of said chamber,
    a gas introducer for introducing into said source chamber a quantity of ionisable gas,
    a single, multiple-turn, helically wound coil antenna positioned around the outside of said source chamber and substantially coaxial with the longitudinal axis of the chamber,
    a radio frequency electric field generator for generating a radio frequency electric field by said antenna,
    a process chamber having a longitudinal axis and forming part of said chamber and adapted to have mounted therein a target and a substrate, and
    a magnetic field generator for generating a magnetic field substantially parallel to the longitudinal axis of the process chamber,
    in use the magnetic field having a magnetic gradient which increases in a direction away from the antenna and in use the generated radio frequency electric field interacting with the lines of magnetic flux in the chamber to create a high density plasma beam to cause the substrate to receive material sputtered from the target.

2. A high density plasma forming apparatus as claimed in claim 1, in which the single, multiple-turn, helically wound coil antenna has three to eight turns.

3. A high density plasma forming apparatus as claimed in claim 2, in which the single, multiple-turn, helically wound coil antenna has three to five turns.

4. A high density plasma forming apparatus as claimed in claim 1, wherein the radio frequency is selected from the group of 6.78 MHz, 13.56 MHz and 27.12 MHz.

5. A high density plasma forming apparatus as claimed in claim 1, wherein the magnetic field generator is a solenoid.

6. A high density plasma forming apparatus configured to sputter material from a target onto a substrate, the apparatus comprising:
    a chamber having a longitudinal axis, the chamber being made of an electrically insulating material,
    an outlet to said chamber,
    an evacuator for evacuating said chamber through said outlet,
    a source chamber forming part of said chamber,
    a gas introducer for introducing into said source chamber a quantity of ionisable gas,
    a single, multiple-turn, helically wound coil antenna having turns in the range of three to eight positioned around the outside of said source chamber and substantially coaxial with the longitudinal axis of the chamber,
    a radio frequency electric field generator for generating a radio frequency electric field by said antenna,
    a process chamber having a longitudinal axis and forming part of said chamber and adapted to have mounted therein a target and a substrate, and
    a magnetic field generator for generating a magnetic field substantially parallel to the longitudinal axis of the process chamber,
    in use the magnetic field having a magnetic gradient which increases in a direction away from the antenna and in use the generated radio frequency electric field interacting with the lines of magnetic flux in the chamber to create a high density plasma beam to cause the substrate to receive material sputtered from the target.

7. A high density plasma forming apparatus as claimed in claim 6, in which the single, multiple-turn, helically wound coil antenna has three to five turns.

8. A high density plasma forming apparatus as claimed in claim 6, wherein the radio frequency is selected from the group of 6.78 MHz, 13.56 MHz and 27.12 MHz.

9. A high density plasma forming apparatus as claimed in claim 6, wherein the magnetic field generator is a solenoid.

10. A high density plasma forming apparatus configured to sputter material from a target onto a substrate, the apparatus comprising:
    a chamber having a longitudinal axis, the chamber being made of an electrically insulating material,
    an outlet to said chamber,
    an evacuator for evacuating said chamber through said outlet,
    a source chamber forming part of said chamber,
    a gas introducer for introducing into said source chamber a quantity of ionisable gas,
    a single, multiple-turn, helically wound coil antenna positioned around the outside of said source chamber and substantially coaxial with the longitudinal axis of the chamber,
    a radio frequency electric field for generating a radio frequency electric field by said antenna,
    a process chamber having a longitudinal axis and forming part of said chamber and adapted to have mounted therein a target and a substrate, and at least one annular solenoid magnet placed coaxially around the chamber and positioned remote from the antenna to in use produce a magnetic field substantially parallel to the longitudinal axis of the process chamber, in use the magnetic field having a magnetic gradient which increases in a direction away from the antenna and in use the generated radio frequency electric field interacting with the lines of magnetic flux in the chamber to create a high density plasma beam to cause the substrate to receive material sputtered from the target.

11. A high density plasma forming apparatus as claimed in claim 10, in which the single, multiple-turn, helically wound coil antenna has three to eight turns.

12. A high density plasma forming apparatus as claimed in claim 11, in which the single, multiple-turn, helically wound coil antenna has three to five turns.

13. A high density plasma forming apparatus as claimed in claim 10, wherein the radio frequency is selected from the group of 6.78 MHz, 13.56 MHz and 27.12 MHz.

14. A high density plasma forming apparatus configured to sputter material from a target onto a substrate, the apparatus comprising:

a chamber having a longitudinal axis, the chamber being made of an electrically insulating material, an outlet to said chamber, an evacuator for evacuating said chamber through said outlet, a source chamber forming part of said chamber, a gas introducer for introducing into said source chamber a quantity of ionisable gas, a single, multiple-turn, helically wound coil antenna positioned around the outside of said source chamber and substantially coaxial with the longitudinal axis of the chamber, a radio frequency electric field generator for generating a radio frequency electric field by said antenna, a process chamber having a longitudinal axis and forming part of said chamber and adapted to have mounted therein a target and a substrate, and at least one annular solenoid magnet placed coaxially around the antenna and spaced axially therefrom for generating a magnetic field substantially parallel to the longitudinal axis of the process chamber, in use the magnetic field having a magnetic gradient which increases in a direction away from the antenna and in use the generated radio frequency electric field interacts with the lines of magnetic flux in the chamber to create a high density plasma beam to cause the substrate to receive material sputtered from the target.

15. A high density plasma forming apparatus as claimed in claim 14, in which the single, multiple-turn, helically wound coil antenna has three to eight turns.

16. A high density plasma forming apparatus as claimed in claim 15, in which the single, multiple-turn, helically wound coil antenna has three to five turns.

17. A high density plasma forming apparatus as claimed in claim 14, wherein the radio frequency is selected from the group of 6.78 MHz, 13.56 MHz and 27.12 MHz.

18. A high density plasma forming apparatus configured to sputter material from a target onto a substrate, the apparatus comprising:

a chamber having a longitudinal axis, the chamber being made of an electrically insulating material, an outlet to said chamber, an evacuator for evacuating said chamber through said outlet, a source chamber forming part of said chamber, a gas introducer for introducing into said source chamber a quantity of ionisable gas, a single, multiple-turn, helically wound coil antenna comprising an electrically conducting strip or wire and positioned around the outside of said source chamber and substantially coaxial with the longitudinal axis of the chamber, a radio frequency power source, a connector for electrically connecting one end of said strip or wire to said power source, a connector for connecting the other end of said strip or wire to ground to enable RF power to pass through each turn of said helically wound single coil antenna to generate a radio frequency electric field by said antenna, a process chamber having a longitudinal axis and forming part of said chamber and adapted to have mounted therein a target and a substrate, and magnetic field generator for generating a magnetic field substantially parallel to the longitudinal axis of the process chamber, in use the magnetic field having a magnetic gradient which increases in a direction away from the antenna and in use the generated radio frequency electric field interacting with the lines of magnetic flux in the chamber to create a high density plasma beam to cause the substrate to receive material sputtered from the target.

19. A high density plasma forming apparatus as claimed in claim 18, in which the single, multiple-turn, helically wound coil antenna has three to eight turns.

20. A high density plasma forming apparatus as claimed in claim 19, in which the single, multiple-turn, helically wound coil antenna has three to five turns.

21. A high density plasma forming apparatus as claimed in claim 18, wherein the radio frequency is selected from the group of 6.78 MHz, 13.56 MHz and 27.12 MHz.

22. A high density plasma forming apparatus as claimed in claim 18, wherein the magnetic field generator is a solenoid.

23. A high density plasma forming apparatus configured to sputter material from a target onto a substrate, the apparatus comprising:

a chamber having a longitudinal axis, the chamber being made of an electrically insulating material, an outlet to said chamber, an evacuator for evacuating said chamber through said outlet, a source chamber forming part of said chamber, a gas introducer for introducing into said source chamber a quantity of ionisable gas, a single, multiple-turn, helically wound coil antenna positioned around the outside of said source chamber and substantially coaxial with the longitudinal axis of the chamber, a radio frequency electric field generator for generating a radio frequency electric field by said antenna, a process chamber forming part of said chamber, and a magnetic field generator for generating a magnetic field substantially parallel to the longitudinal axis of the process chamber, in use the magnetic field having a magnetic gradient which increases in a direction away from the antenna and in use the generated radio frequency electric field interacting with the lines of magnetic flux in the chamber to create a high density plasma beam in which the argon ion efficiency is in excess of thirty percent to cause the substrate to receive material sputtered from the target.

24. A high density plasma forming apparatus as claimed in claim 23, in which the single, multiple-turn, helically wound coil antenna has three to eight turns.

25. A high density plasma forming apparatus as claimed in claim 24, in which the single, multiple-turn, helically wound coil antenna has three to five turns.

26. A high density plasma forming apparatus as claimed in claim 23, wherein the radio frequency is selected from the group of 6.78 MHz, 13.56 MHz and 27.12 MHz.

27. A high density plasma forming apparatus as claimed in claim 23, wherein the magnetic field generator is a solenoid.

28. A high density plasma forming apparatus configured to sputter material from a target onto a substrate, the apparatus comprising:
a chamber having a longitudinal axis, the chamber being made of an electrically insulating material,
an outlet to said chamber,
an evacuator for evacuating said chamber through said outlet,
a source chamber forming part of said chamber,
a gas introducer for introducing into said source chamber a quantity of ionisable gas,
a process chamber having a longitudinal axis and forming part of said chamber and adapted to have mounted therein a target and a substrate, said source chamber and said process chamber being in line on the same axis,
a single, multiple-turn, helically wound coil antenna positioned around the outside of said source chamber and substantially coaxial with the longitudinal axis of the chamber,
a radio frequency electric field generator for generating a radio frequency electric field by said antenna,
a magnetic field generator for generating a magnetic field substantially parallel to the longitudinal axis of the process chamber,
in use the magnetic field having a magnetic gradient which increases in a direction away from the antenna and in use the generated radio frequency electric field interacting with the lines of magnetic flux in the chamber to create a high density plasma beam to cause the substrate to receive material sputtered from the target,
a termination chamber having substantially the same initial diameter as said source chamber and tapering away from the process chamber from which it extends, the process chamber being between the source chamber and the termination chamber, and
a cooling coil being associated with the termination chamber.

29. A high density plasma forming apparatus as claimed in claim 28, in which the single, multiple-turn, helically wound coil antenna has three to eight turns.

30. A high density plasma forming apparatus as claimed in claim 29, in which the single, multiple-turn, helically wound coil antenna has three to five turns.

31. A high density plasma forming apparatus as claimed in claim 28, wherein the radio frequency is selected from the group of 6.78 MHz, 13.56 MHz and 27.12 MHz.

32. A high density plasma forming apparatus as claimed in claim 28, wherein the magnetic field generator is a solenoid.

33. A high density plasma forming apparatus configured to sputter material from a target onto a substrate, the apparatus comprising:
a chamber having a longitudinal axis, the chamber being made of an electrically insulating material,
an outlet to said chamber,
an evacuator for evacuating said chamber through said outlet,
a source chamber forming part of said chamber,
a gas introducer for introducing into said source chamber a quantity of ionisable gas,
a single, multiple-turn, helically wound coil antenna positioned around the outside of said source chamber and substantially coaxial with the longitudinal axis of the chamber,
a radio frequency electric field generator for generating a radio frequency electric field by said antenna,
a process chamber having a longitudinal axis and forming part of said chamber and adapted to have mounted therein a target and a substrate,
a magnetic field generator for generating a magnetic field substantially parallel to the longitudinal axis of the process chamber,
in use the magnetic field having a magnetic gradient which increases in a direction away from the antenna and in use the generated radio frequency electric field interacting with the lines of magnetic flux in the chamber to create a high density plasma beam to cause the substrate to receive material sputtered from the target, and
a steering magnetic field generator for generating a steering magnetic field whereby the plasma beam can be steered towards or away from the steering magnetic field generator.

34. A high density plasma forming apparatus as claimed in claim 33, in which the single, multiple-turn, helically wound coil antenna has three to eight turns.

35. A high density plasma forming apparatus as claimed in claim 34, in which the single, multiple-turn, helically wound coil antenna has three to five turns.

36. A high density plasma forming apparatus as claimed in claim 33, wherein the radio frequency is selected from the group of 6.78 MHz, 13.56 MHz and 27.12 MHz.

37. A high density plasma forming apparatus as claimed in claim 33, wherein the magnetic field generator is a solenoid.

38. A high density plasma forming apparatus as claimed in claim 33, further comprising a termination chamber tapering away from the process chamber from which it extends, the process chamber being between the source chamber and the termination chamber.

39. A high density plasma forming apparatus as claimed in claim 38, further comprising a cooling coil positioned around the termination chamber.

40. A high density plasma forming apparatus as claimed in claim 38, wherein the magnetic field generator is a solenoid.

41. A high density plasma forming apparatus configured to sputter material from a target onto a substrate, the apparatus comprising:

a substantially T-shaped chamber having three limbs and being made of an electrically insulating material, an outlet to said chamber, an evacuator for evacuating said chamber through said outlet, a source chamber comprising a first of said limbs and forming part of said chamber, a gas introducer for introducing into said source chamber a quantity of ionisable gas, a process chamber comprising the second and third limbs and forming part of said chamber, a single, multiple-turn, helically wound coil antenna positioned around the outside of said source chamber and substantially coaxial with the longitudinal axis of said chamber, a radio frequency electric field generator for generating a radio frequency electric field by said antenna, a magnetic field generator for generating a magnetic field in the process chamber so that in use the magnetic field has a magnetic gradient which increases in a direction away from the antenna and so that in use the generated radio frequency electric field interacts with the lines of magnetic flux in the chamber to create a high density plasma, a mount for mounting a target in a first limb of the process chamber, and a mount for mounting a substrate in a second limb of the process chamber, the positions of the antenna, the target and the substrate being such that the coating of the inner wall of the second chamber by target material is minimized thus minimizing RF leakage form the antenna.

42. Apparatus as claimed in claim 41, which the plasma generated within the first limb enters the process chamber in a first direction and is deflected through an angle from said first direction within the process chamber.

43. A high density plasma forming apparatus as claimed in claim 42, wherein said angle is 90 degrees.

44. A high density plasma forming apparatus as claimed in claim 42, wherein said angle is 45 degrees.

45. A high density plasma forming apparatus as claimed in claim 41, in which the single, multiple-turn, helically wound coil antenna has three to eight turns.

46. A high density plasma forming apparatus as claimed in claim 45, in which the single, multiple-turn, helically wound coil antenna has three to five turns.

47. A high density plasma forming apparatus as claimed in claim 41, wherein the radio frequency is selected from the group of 6.768 MHz, 13.56 MHz and 27.12 MHz.

48. A high density plasma forming apparatus configured to sputter material from a target onto a substrate, apparatus comprising:

a chamber having a longitudinal axis, the chamber being made of an electrically insulating material, an outlet to said chamber, an evacuator for evacuating said chamber through said outlet, a source chamber forming part of said chamber, a gas introducer for introducing into said source chamber a quantity of ionisable gas, a single, multiple-turn, helically wound coil antenna positioned around the outside of said source chamber and substantially coaxial with the longitudinal axis of the chamber, a radio frequency electric field generator for generating a radio frequency electric field by said antenna, a process chamber having a longitudinal axis and forming part of said chamber and adapted to have mounted therein a target and a substrate, an annular solenoid source magnet positioned around the outside of the source chamber and downstream of the antenna between the antenna and the process chamber in relation to the longitudinal axis, and an annular solenoid chamber magnet positioned around the outside of an extension of the process chamber, the source magnet and the chamber magnet being energizable to generate respective magnetic fields in the same direction, the two magnetic fields being linked and being substantially parallel to the longitudinal axis of the process chamber and in use having a magnetic gradient which increases in a direction away from the antenna and in use the generated radio frequency electric field interacting with the lines of magnetic flux in the chamber to create a high density plasma beam to cause the substrate to receive material sputtered from the target.

49. A high density plasma forming apparatus as claimed in claim 48, in which the single, multiple-turn, helically wound coil antenna has three to eight turns.

50. A high density plasma forming apparatus as claimed in claim 49, in which the single, multiple-turn, helically wound coil antenna has three to five turns.

51. A high density plasma forming apparatus as claimed in claim 48, wherein the radio frequency is selected from the group of 6.78 MHz, 13.56 MHz and 27.12 MHz.

* * * * *